United States Patent
Pardo et al.

(10) Patent No.: US 7,564,138 B2
(45) Date of Patent: Jul. 21, 2009

(54) METHOD FOR ATTACHING CHIPS IN A FLIP-CHIP ARRANGEMENT

(75) Inventors: Flavio Pardo, New Providence, NJ (US); Maria Elina Simon, New Providence, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 0 days.

(21) Appl. No.: 11/020,590

(22) Filed: Dec. 23, 2004

(65) Prior Publication Data

US 2006/0138605 A1 Jun. 29, 2006

(51) Int. Cl.
*H01L 23/58* (2006.01)
*H05B 3/10* (2006.01)

(52) U.S. Cl. .............................. 257/777; 257/E23.081; 219/209; 438/466

(58) Field of Classification Search ................. 361/770; 257/643, E33.075, 777, E23.081; 438/466; 219/209
See application file for complete search history.

(56) References Cited

U.S. PATENT DOCUMENTS

| | | | | |
|---|---|---|---|---|
| 4,110,506 A | * | 8/1978 | Cottingham et al. | 428/138 |
| 4,769,525 A | * | 9/1988 | Leatham | 219/209 |
| 4,923,421 A | | 5/1990 | Brodie et al. | 445/24 |
| 5,037,689 A | * | 8/1991 | Boyd | 428/113 |
| 5,624,750 A | * | 4/1997 | Martinez et al. | 428/344 |
| 5,767,569 A | * | 6/1998 | Ohta et al. | 257/668 |
| 5,844,168 A | * | 12/1998 | Schueller et al. | 174/558 |
| 5,870,289 A | * | 2/1999 | Tokuda et al. | 361/779 |
| 5,932,345 A | * | 8/1999 | Furutani et al. | 428/364 |
| 5,938,956 A | * | 8/1999 | Hembree et al. | 219/209 |
| 6,031,729 A | * | 2/2000 | Berkely et al. | 361/771 |
| 6,339,210 B1 | * | 1/2002 | Hembree et al. | 219/209 |
| 2002/0057506 A1 | * | 5/2002 | Kaneko | 359/846 |
| 2004/0165363 A1 | * | 8/2004 | Lifton et al. | 361/770 |

\* cited by examiner

*Primary Examiner*—David Vu
*Assistant Examiner*—Earl N Taylor

(57) ABSTRACT

Targeted heating is employed to essentially only heat a material that is used as a spacer and to bond a first chip of a flip-chip to a second chip thereof and not the rest of the chips. In order to heat only the spacer-bonding material, one or more wires are located within, or adjacent to, the spacer-bonding material, and an electrical current is passed through the one or more wires causing them to heat. At the time of final bonding the heat generated by the one or more wires causes the spacer-bonding material to heat to its final curing temperature.

19 Claims, 5 Drawing Sheets

METHOD FOR ATTACHING CHIPS IN A FLIP-CHIP ARRANGEMENT

TECHNICAL FIELD

This invention relates to the art of flip-chips, which are two separate chips bonded together, and more particularly, to a method for connecting the chips that are connected together in a flip-chip arrangement using a spacer between the chips.

BACKGROUND OF THE INVENTION

Flip-chip assemblies are formed by combining two separate chips. Usually one of the chips contains spacers that offset the facing surfaces of each of the chips. Micro-electromechanical systems (MEMS) devices for optical applications typically require the fabrication of arrays of micro-mirrors that are tilted using electrostatic control using a set of electrodes located beneath, and/or adjacent to, the micro-mirror. The gap between the mirror and the electrodes is a crucial characteristic of the MEMS device because it determines, among other things, the maximum achievable tilt angle. This is because, if the plate of the micro-mirror is located too close to the substrate on which the electrodes are mounted with respect to the size of the mirror plate, the plate will impact on the substrate, thus limiting the range of tilt.

In the following descriptions, the term "wafer" and the term "chip" may be used interchangeably, assuming there is only one chip per wafer. If there is more than one chip per wafer, than then the term "chip" refers to a smaller unit that is separated from the wafer by a dicing operation. Such dicing operation may be performed prior to, or after, formation of the flip-chip assembly.

In the prior art, a flip-chip arrangement is not required for small gaps. Instead, in a single wafer, a so-called "sacrificial" film is formed where the gap is ultimately desired, and the sacrificial film is etched away during manufacturing to release the mirror plate. This approach is only practical for thin sacrificial films, e.g., on the order of few microns, because mechanical stress develops in thicker sacrificial films, causing destruction of the device. This approach is thus of limited use when large gaps are required, e.g., for larger micro-mirrors with larger angular tilt range requirements.

To achieve larger gaps, the most common technique is to employ a flip-chip arrangement. Typically, the moving portion of the device is formed on one wafer, while the electrodes are formed on another. The wafer on which the moving portion is formed is typically a silicon on insulator (SOI) type of wafer. An exemplary SOI wafer is made of three layers. The first layer is a so-called "handle" wafer layer, which is silicon. The second layer, a buried oxide layer (BOX) which is also known as the "sacrificial layer", is an insulator. The third layer, the "mechanical" layer, is also silicon, although it a) is typically much thinner than handle wafer layer and b) may be referred to as the device layer. The wafer on which the moving portion is formed is etched to remove portions of its handle wafer and its BOX layer so as to free the moving structure. The remaining portion of the handle wafer is then anodically, i.e., field assisted, or fusion bonded to the electrode containing wafer, with the result being that the thickness of the handle wafer defines the gap between the electrodes and the moving portion. However, this approach limits considerably the available materials and process sequences that may be employed.

For example, for anodic bonding at least one material must be insulating and the thermal expansion coefficients of the two materials must be nearly the sane. Suitable such materials are silicon and silicon oxide. The surfaces of the two materials should also be clean and polished smooth. To achieve the anodic bond a relatively large voltage is applied across the two pieces to be bonded at an elevated temperature, e.g., between 300° C. and 450° C. Because of the necessity of high temperature, unwanted reactions may result with any metalized section of the device being formed, and so anodic bonding is not especially suitable to forming MEMS devices such as micro-mirrors.

Alternatively, fusion, i.e., direct, bonding does not require applied voltages or that either material be an insulator. Bonding is achieved primarily through chemical reactions between materials on the two surfaces. The two chips are mated together at room temperature and then annealed at high temperatures, e.g., on the order of 1100° C. for silicon, to increase the bond strength.

In order to survive either anodic or fusion bonding, the moving parts of the device being assembled have to be freed only after the bonding is completed. This requires that both chips be compatible with the etchant used to release the moving parts. Furthermore, since the thickness of one of the chips is determinative of the final gap, use of these bonding techniques limits the gap sizes to relatively large gaps, e.g., larger than 200 microns, because the flip-chip wafers must be at least that thick in order to handle them through the various process steps without breaking them.

Polyimides (PI) are a polymerized organic polymer which has been used in various prior art applications, e.g., to provide a protective coating for integrated circuits or as a thick dielectric. Various polyimide compound formulations are available, where various additives are combined with the polyimide to provide an overall material with particular prescribed characteristics. Use of polyimide as a spacer is taught in the prior art. For example, U.S. Pat. No. 4,923,421 teaches the use of fully baked polyimide as a spacer between the display face and the cathode surface of a flat panel display. However, in the prior art the polyimide functions only as a spacer. Other techniques are employed to keep the spaced apart elements together, e.g., in U.S. Pat. No. 4,923,421 the display face and the cathode surface are sandwiched together and sealed to form the final display.

In U.S. patent application Ser. No. 10/371,258 it was recognized that not only can polyimide be used as a spacer, it can also be used to bond together the elements that it is spacing apart, e.g., the various wafers that are assembled together to form a flip-chip. This is achieved by constructing the spacer on at least one of the wafers as is typically done, except that prior to performing the final curing of the polyimide precursor to form the final polyimide, the flip-chips are aligned in a flip-chip or wafer bonder and placed in contact under pressure at a temperature slightly higher than the soft-bake temperature as specified by the polyimide manufacturer of the polyimide precursor for few minutes to promote tackiness. A useful temperature slightly higher than the soft-bake temperature, when the soft-bake temperature is, for example, 100° C., was found to be about e.g., 120° C., and a useful contact pressure was found to be 40 grams per square millimeter. This holds the flip-chips together, and the combined structure is then baked to fully cure the polyimide precursor into polyimide and complete the bonding of the flip-chips to the polyimide.

Advantageously, the maximum temperature of the bonding process need be no higher than the temperature needed to achieve the final curing of the polyimide, e.g., 200° C., which is considerably lower than the temperatures required for prior art flip-chip bonding procedures. Further advantageously, the moving parts may be released before or after the flip-chips are bonded together, thus allowing the processes employed for each chip to be independently optimized.

Polyimide spacers may be made to achieve gap heights ranging from about 5 microns to about 200 microns. To achieve such gap heights the "top" chip is typically assembled with its handle "up". If the "top" chip is mounted handle "down" the gap will be the height of the polyimide spacers plus the thickness of the wafer of the "top" chip.

Note that polyimide spacers can be made on each wafer, and the spacers on each wafer aligned and bonded to create combined spacers, thus doubling the maximum spacing achievable with a polyimide spacer on only one of the wafers.

SUMMARY OF THE INVENTION

We have recognized that even the lower temperature needed to achieve the final curing of the polyimide in U.S. patent application Ser. No. 10/371,258, e.g., 200° C., and the final temperature for curing other materials that can perform the spacer-bonding function, may still be too high for various structures, e.g., mirrors, formed on at least one of the chips. This problem is avoided, in accordance with the principles of the invention, by employing targeted heating that essentially only heats the spacer-bonding material, e.g., polyimide, photo benzocyclobutene (photo BCB) such as Cyclotene™ 4000 Series Advanced Electronic Resins available from Dow Chemicals, or the like, to a desired temperature, e.g., the final curing temperature, and not the rest of the chips. In order to heat only the spacer-bonding material, one or more wires are located within, or adjacent to, the spacer-bonding material, and an electrical current is passed through the one or more wires causing them to heat. Heat may be applied to the spacer from the wire whenever heat is required as part of the process of forming the spacer and bonding it to the other chip. In accordance with an aspect of the invention, at the time of final bonding the heat generated by the one or more wires causes the spacer-bonding material to heat to its final curing temperature.

Advantageously, the bonding process may be performed while the chips are in a room temperature environment.

Further advantageously, essentially only the spacer-bonding material and the contact points of the chips to polyimide are heated, while the rest of the chips remain relatively cool. Although some of the heat of the polyimide may be transferred to surrounding areas of the chips, e.g., due to conventional heat transfer by convection and conduction through the air, conduction through the chip material from the spacer-bonding material, and radiation mechanisms, with proper design, the heat sensitive structures of the chips can be kept far enough away from the heated areas of the chips so that they are not damaged by the heating of the spacer-bonding material. In one embodiment of the invention, the bonding of the chips by heating of the spacer-bonding material via one or more wires is performed in a vacuum. By doing so the heat transference by convection and conduction through the air are eliminated. This significantly reduces the heating of areas of the chips adjacent to the heated spacer-bonding material.

The targeted heating may also be employed to promote tackiness of the spacer-bonding material for the initial coupling of the chips prior to the final curing.

DETAILED DESCRIPTION

Figure 1:
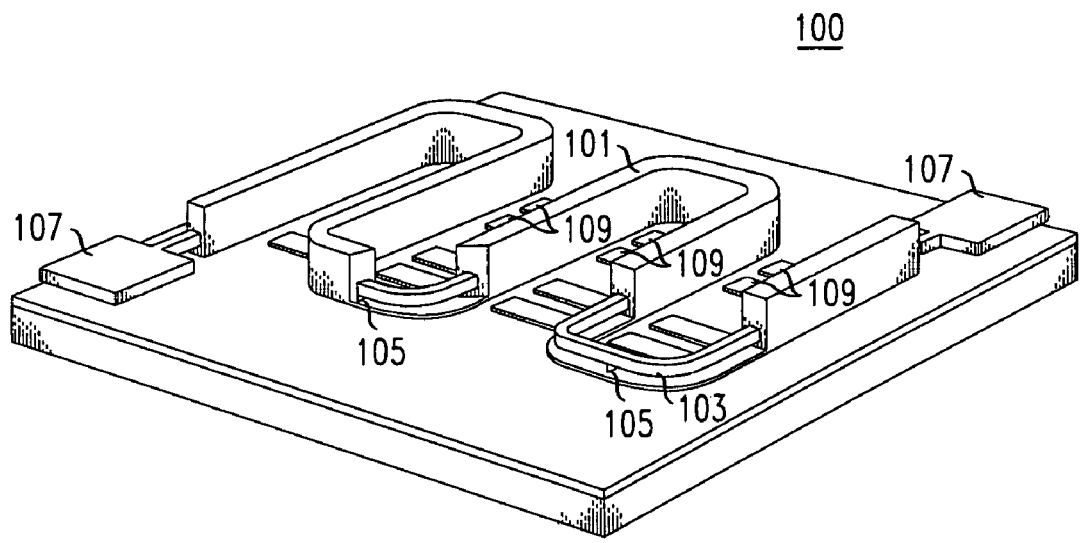
FIG. 1 shows an exemplary chip adapted to be employed in a flip-chip arrangement in accordance with the principles of the invention.

The following merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the invention. Similarly, it will be appreciated that any flow charts, flow diagrams, state transition diagrams, pseudocode, and the like represent various processes which may be substantially represented in computer readable medium and so executed by a computer or processor, whether or not such computer or processor is explicitly shown.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein.

Software modules, or simply modules which are implied to be software, may be represented herein as any combination of flowchart elements or other elements indicating performance of process steps and/or textual description. Such modules may be executed by hardware which is expressly or implicitly shown.

The term micro-electromechanical systems (MEMS) device as used herein is intended to mean an entire MEMS device or any portion thereof. Thus, if a portion of a MEMS device is inoperative, or if a portion of a MEMS device is occluded, such a MEMS device is nonetheless considered to be a MEMS device for purposes of the present disclosure.

In the description, identically numbered components within different ones of the FIGS. refer to the same components.

FIG. 1 shows exemplary chip 100 adapted to be employed in a flip-chip arrangement. In accordance with the principles of the invention, chip 100 has at least one spacer 101 within which is at least one wire 103. When electricity is passed through wire 103, wire 103 heats up, thereby heating up spacer 101. This may be done whenever heat needs to be applied to spacer 101 during the process of bonding chip 100 with another chip to form the flip-chip arrangement. For example, electricity may be supplied so that the heat generated by wire 103 heats the material of spacer 101 to its final curing temperature.

More specifically, shown in FIG. 1 are a) spacer 101, b) wire 103, c) optional wire supports 105, d) electrical contact pads 107, and electrodes 109.

Spacer 101 is essentially a conventional spacer made of a material that is not only capable of acting as a spacer to support another chip, but is also able to bond directly to the material of the other chip. However, initially, it is not fully cured. Rather, it is so-called "softbaked" or "prebaked". For example, spacer 101 may be made of polyimide or photo benzocyclobutene (photo BCB). For polyimide, softbaking is done starting at room temperature and using a gradual increasing temperature ramp of about 2 degrees per minute up to a temperature of 100° C. to keep the surface smooth and suitable for bonding. Once the 100° C. temperature is reached, the softbaking continues for about 20 minutes. The purpose of this softbaking is to remove much of the organic solvents from the precursor.

In the embodiment of the invention shown in FIG. 1, spacer 101 is formed so that it surrounds wire 103. Although spacer 101 is shown with sections cut away so that wire 103 can be seen, it is noted that a single wire 103 may pass through multiple separate spacers, such as would result if the cut-away sections were actually not part of spacer 101.

Wire 103 is a wire that heats up when electricity is passed through it. For example, during the process of bonding of chip 100 with another chip to form the flip-chip arrangement an electrical current is passed through wire 103 causing it to heat. The heat generated by wire 103 heats the material of spacer 101 as required for the bonding process. Wire 103 may a) heat to a temperature such that the entire spacer heats to the curing temperature of the spacer material and b) maintain that temperature for the time required to complete the curing.

For example, if the spacer material is Arch Chemical's Durimide® 7520, the manufacturer's recommended hard bake curing process is to heat the precursor at 350° C. for one hour. Doing so yields a bond shear strength of about 50 kg force for a 1 cm² chip with polyimide spacer covering about one fifth of the total area. However, using such a high temperature may not be desirable in various applications. Therefore, it has been found that the hard bake curing may instead be performed at 200° C. for three hours while achieving substantially the same final bond strength. Furthermore, it has been found that by raising the temperature the time may be reduced, thus providing a range of temperature and time that may be suitable for various applications.

As another example, if the spacer material is Dow Chemical's Photo BCB, a manufacturer's recommended hard bake curing process is to heat the precursor at between 250° C. for about an hour. Furthermore, it has been found that by raising the temperature the time may be reduced, thus providing a range of temperature and time that may be suitable for various applications.

Wire 103 may be made of, for example, metal, polysilicon, or the like. The size of the wire is dictated by the processing needs of the particular application, as will be readily appreciated by those of ordinary skill in the art. With a polyimide spacer that is 40 microns thick, a useful size for wire 103 has been found to be a cross section that is 1 to 2 microns square. Wire 103 may, for example, heat up to 600° C.

Wire supports 105 holds wire 103 offset from the surface of chip 100. By holding wire 103 offset from the surface of chip 100, it is possible to manufacture spacers that, for the most part, completely engulf the portion of wire 103 that passes through them. Wire supports 105 may be part of wire 103. This may be achieved by forming vias to a layer isolated from the substrate of chip 100 through a sacrificial layer of silicon oxide deposited on top of the layer to which wire 103 is to be connected. A conductive layer, e.g., polysilicon or metal, out of which wire 103 is to be formed, is deposited on top of the sacrificial layer of silicon oxide, filling up the vias and attaching to the isolated layer. The conductive layer is patterned and etched to form wire 103. Thereafter, the sacrificial layer is etched to release the wire.

Alternatively, a timed etch may be performed, leaving a substantial portion of the sacrificial silicon oxide layer that is located below the wire. Such an approach may be more advantageously used when wire 103 is shaped similar to a flat ribbon. This would leave wire 103 resting upon a layer of silicon oxide. The spacer material may then be deposited on top of the wire. It may also surround the oxide layer below the wire. The combined spacing height would then be the combined height of the thickness of the silicon oxide layer, the thickness of wire 103, the height of the spacer, and the height of any layers below the silicon oxide layer.

Wire 103 may be made up of several portions, where the various portions a) may be made from different materials, b) may have different geometries, or c) a combination of both. As a result, some of the portions may heat up, while others may essentially not heat up at all. Furthermore, those portions that do heat may heat to different temperatures. Advantageously, those of ordinary skill in the art may design wire 103 to apply the necessary amount of heat where it is needed, and preferably, no more.

Electrical contact pads 107 are sections of wire 103 that are conveniently employed to couple a current to wire 103. Electrical contact pads 107 may be formed in any conventional technique, e.g., using one of the techniques above to form wire 103. However, for example, if vias are employed, the vias for electrical contact pads 107 would be larger than those employed to form wire supports 105.

Electrodes 109 are conventional electrodes formed in a conventional manner. Electrodes 109 may be employed to control the position of a MEMS mirror which is formed in the opposite chip that is bonded using spacer 101.

Figure 4:
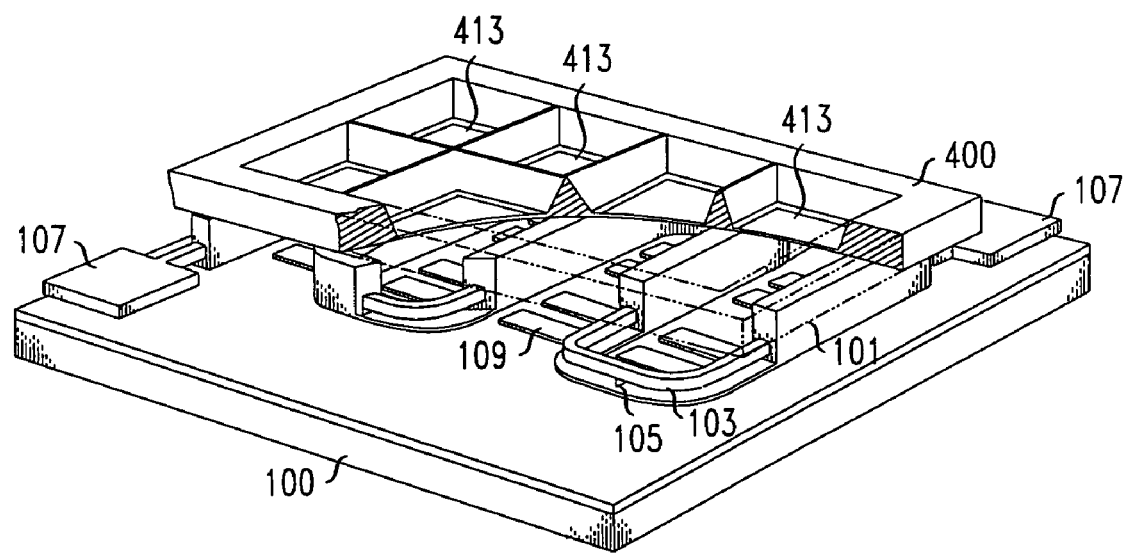
FIG. 4 shows the exemplary embodiment of the invention shown in FIG. 1 after another chip is bonded thereto.

FIG. 4 shows the exemplary embodiment of the invention shown in FIG. 1 after chip 400, with mirrors 413, is bonded to chip 100. Note that chip 400 is shown as a cut-away view so that some of the structures of chip 100 remain visible.

Figure 2:
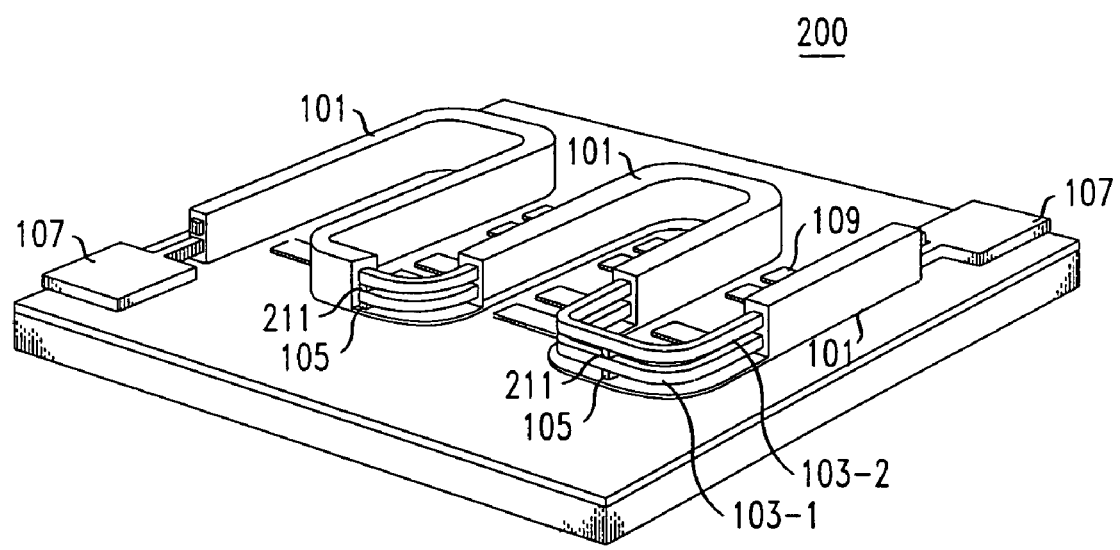
FIG. 2 shows another exemplary chip adapted to be employed in a flip-chip arrangement in accordance with the principles of the invention.

Similar to exemplary chip 100 of FIG. 1, FIG. 2 shows exemplary chip 200 adapted to be employed in a flip-chip arrangement. In accordance with the principles of the invention, chip 200 has at least one spacer within which are at least two wires 103. During the process of bonding of chip 200 with another chip to form the flip-chip arrangement, an electrical current is passed through wires 103 causing them to heat. The heat generated by wires 103 heats the material of spacer 101 as may be required for the bonding process.

In the exemplary embodiment of the invention shown in FIG. 2, each of wires 103, which includes at least wires 103-1 and 103-2, is electrically connected to each other and to electrical contact pads 107 by wire supports 211, which are electrically conducting. For example, wire supports 211 are made of the same material as are wires 103. Those of ordinary skill in the art, however, will readily recognize that each of wires 103 may be electrically isolated from each other. In such an embodiment of the invention, an additional set of electrical contact pads will be required for each wire that is electrically independent. However, advantageously, since the wires may be heated independently, finer control over the heating, and the resulting temperature reached by any part of the device, may be achieved. Thus, for example, only one wire may be heated to achieve soft baking, while both wires may be heated simultaneously to achieve final curing.

Figure 3:
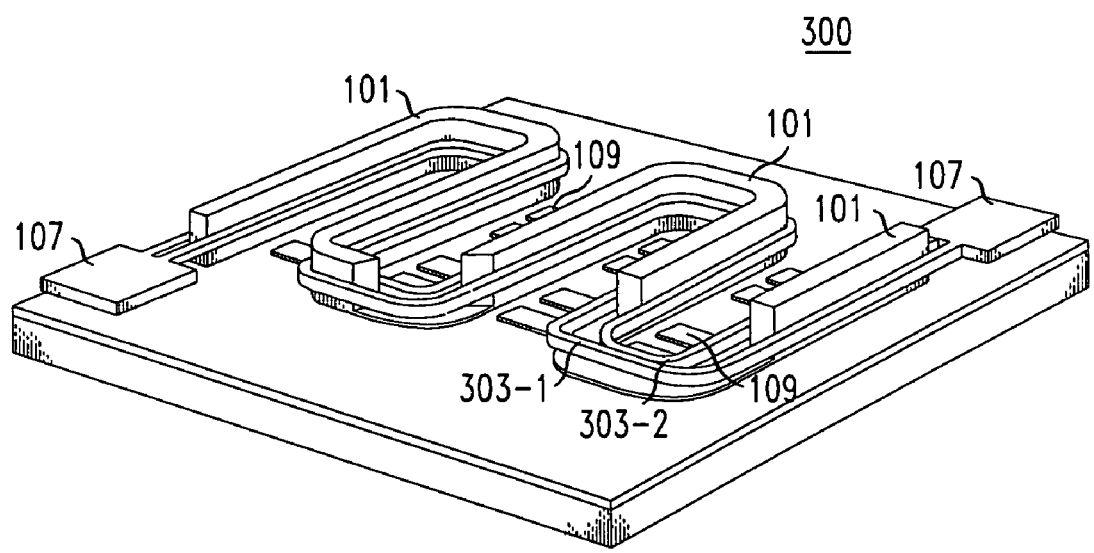
FIG. 3 shows a further exemplary chip adapted to be employed in a flip-chip arrangement in accordance with the principles of the invention.

Similar to exemplary chip 100 of FIG. 1, FIG. 3 shows exemplary chip 300 adapted to be employed in a flip-chip arrangement. In accordance with the principles of the invention, chip 100 has at least one spacer 101 alongside of which are one or more wires 303. During the process of bonding of chip 300 with another chip to form the flip-chip arrangement, an electrical current is passed through one or more of wires 303 causing them to heat. The heat generated by wires 303 heats the material of spacer 101 as may be required for the bonding process.

At the time of bonding of chip 300 with another chip to form the flip-chip arrangement an electrical current is passed through one or more wires 303 causing them to heat. The heat of the one or more wires 303 heats the material of spacer 101 to its final curing temperature. FIG. 3 shows two wires 303 associated with spacer 101. However, only one such wire, e.g., wire 303-1 is required. Any additional such wires associated with spacer 101, e.g., wire 303-2, is optional at the discretion of the implementer. Although shown in FIG. 3 as being resting ribbon-like upon a layer of silicon oxide, wires 303 could be formed as previously discussed using wire supports.

Although the wires have been disclosed herein as having a primary purpose of heating the spacers, it is possible that during operation of the flip-chip device that the wires may be used for other purposes, e.g., as part of a circuit.

Figure 5:
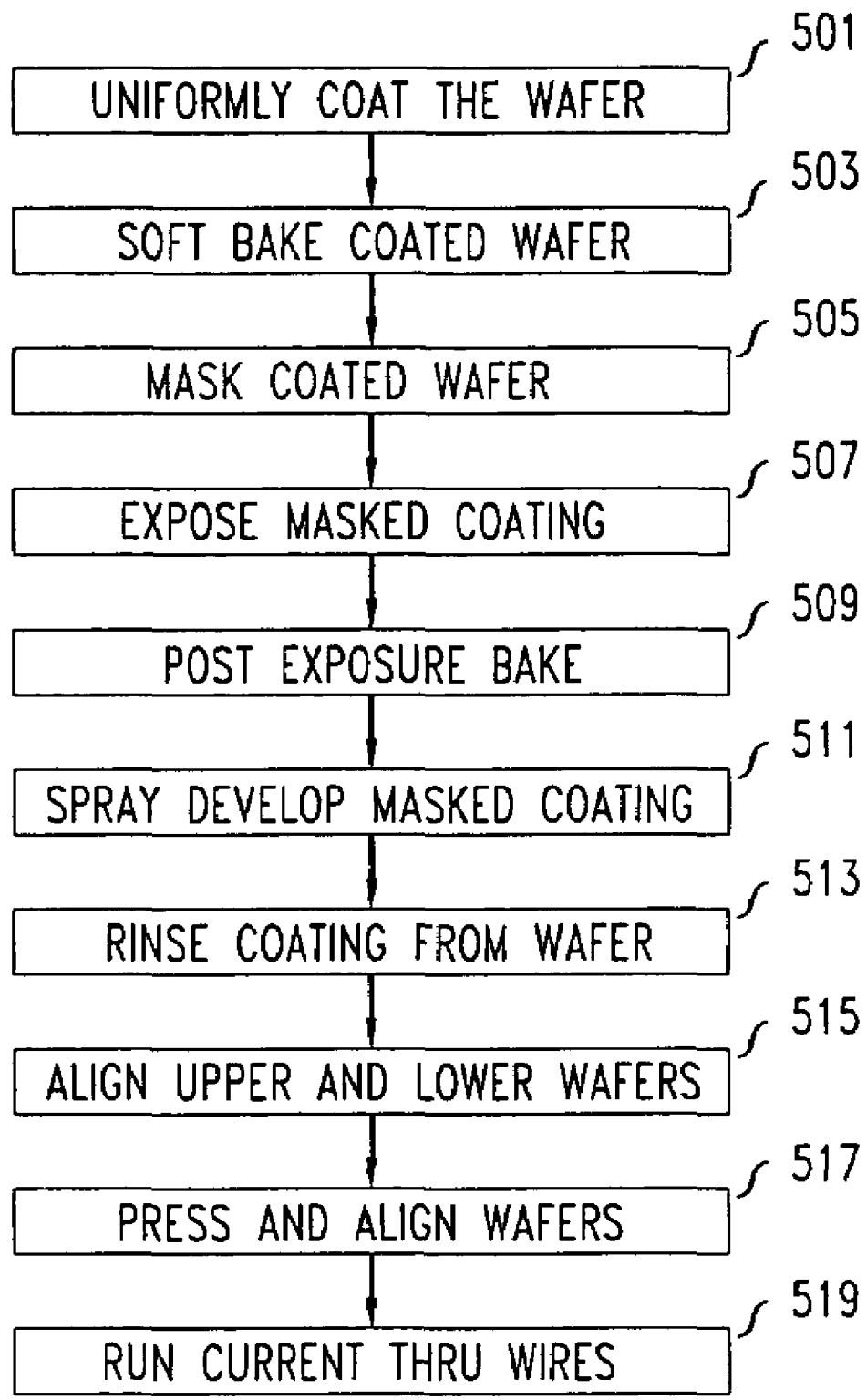
FIG. 5 shows an exemplary process, by which a spacer material is used both as a spacer as well as being used simultaneously as a bonding agent to hold together the elements that it is spacing apart, in accordance with the principles of the invention.

FIG. 5 shows an exemplary process, by which a spacer material, e.g., polyimide, photo BCB, or the like, is used both as a spacer as well as being used simultaneously as a bonding agent to hold together the elements that it is spacing apart. This is achieved by constructing the spacer on at least one of the wafers as is typically done in the prior art, except that prior to performing the final curing of the spacer precursor to form the final spacer the flip-chips are aligned in a flip-chip or wafer bonder and placed in contact under pressure and the spacer material is heated, e.g., using wires embedded or adjacent thereto, to a temperature slightly higher than the soft-bake temperature as specified by the spacer material manufacturer for few minutes to promote tackiness. For polyimide, a useful temperature slightly higher than the soft-bake temperature, when the soft-bake temperature is, for example, 100° C., has been found to be about e.g., 120° C., and a useful contact pressure has been found to be 40 grams per square millimeter. This initially holds the flip-chips together. The spacer precursor is then heated, e.g., using wires embedded or adjacent thereto, to fully cure the polyimide precursor into polyimide and complete the bonding of the flip-chips to the polyimide. Those of ordinary skill in the art will be readily able to determine the corresponding temperatures and pressures for photo BCB, which are similar.

In accordance with the principles of the invention, at least one of the heating steps required for achieving the bond, and preferably the step requiring the highest temperature, is performed by heating the spacer material using a wire in, or adjacent to, the spacer material.

For pedagogical purposes, it will be assumed, for the initial exposition, that the wafer is sized to be used in only a single device. Also, for simplicity, only polyimide will be discussed. However, those of ordinary skill in the art will readily be able to determine the corresponding values for other materials.

The process of FIG. 5 is entered when it is desired to construct a polyimide spacer that also bonds together the elements being spaced apart on a wafer that already has formed on it at least one wire that heats when electricity is passed through it, the wire being located such that it is adjacent to the location of the spacer to be formed, or is within the volume that the spacer will occupy when formed. Such a wire may be conventionally made as described herein above. In step 501 a uniform coating of polyimide precursor, e.g., Arch Chemical's Durimide® 7520, is placed on the wafer. This may be achieved by well known coating methods such as a spinning operation or by extrusion coating. Uniformly applying the precursor assures that the spacers when formed will have a uniform height.

For spinning, the precursor is placed onto the wafer after the wafer is set up on a chuck or the like for spinning. The precise amount poured may be controlled by using a repeater pipette, such as the Eppendorf® repeater pipette. When using Arch Chemical's Durimide® 7520, which has a high viscosity, the precursor is poured out at the center of the wafer while the wafer is spinning at 250 RPM. The speed is then increased to the final speed for a sufficiently long time to provide the desired coating thickness. For example, the substrate is spun at 755 RPM for approximately 45 seconds. The viscous precursor formulation will form a uniform coating layer on the wafer having a thickness of about 80 microns.

For extrusion coating, a FAS Technologies MicroE™ extrusion coating system is employed. Using, for example, a pump speed of 200 microliters/second and a head speed of 6 mm/s, a thickness of 80 microns may be achieved.

It should be noted that the spacers could be formed on either of the parts to be bonded.

In step 503, the wafer is softbaked, also known as prebaked. In accordance with aspect of the invention, the softbaking may be performed, in accordance with the principles of the invention, by passing current through the one or more wires embedded in, or adjacent to, the spacer. However, since the ultimate temperature achieved by the softbaking is relatively low, the implementer may elect to perform the softbaking in the conventional manner. The softbaking is done starting at room temperature and using a gradual increasing temperature ramp of about 2 degrees per minute up to a temperature of 100° C. to keep the surface smooth and suitable for bonding. Once the 100° C. temperature is reached, the softbaking continues for about 20 minutes. The purpose of this softbaking is to remove much of the organic solvents from the precursor.

In step 505, a lithographic mask patterned with the desired spacer pattern is aligned with the wafer. It is important that the mask be properly aligned to assure that the final spacers will be located correctly. It should be noted that the technology for accurate masking is quite well developed relative to the formation of integrated circuits, and it is easy with available equipment to obtain the accurate alignment that is necessary when integrated circuit techniques are being used to form the spacers. After the mask is appropriately aligned with the wafer substrate, the wafer is exposed, in step 507, by being subjected to broadband radiation in the ultraviolet frequency range, e.g., a dose of about 400 mJ/cm$^2$.

In step 509, the wafer is then subject to a post-exposure bake by heating the wafer. Again, this heating may be performed in accordance with the principles of the invention by passing current through the one or more wires embedded in, or adjacent to, the spacer. However, since the ultimate temperature for the post-exposure bake is relatively low, the implementer may elect to perform the post-exposure bake in the conventional manner. The post-exposure bake is performed at a temperature of approximately 100° C. for about 5 minutes.

In step 511 the wafer is then loaded into a spray developer and sprayed using an atomizing spray nozzle, with an appropriate developer material, such as the QZ3501 developer available from the previously mentioned Arch Chemicals, until one can visually see the development. The portion of the coating that was not exposed to the UV light, because it was blocked by the pattern on the mask, is then removed from the wafer in step 513 by rinsing it with an appropriate rinse solution, such as QZ3501 rinse solution also available from Arch Chemicals. Thus all that is left are only those portions that form the desired spacers. So long as the wire is narrower than the spacer, any material below the wire that is not exposed to the ultraviolet light will be prevented from being washed away by the developer by the other material which surrounds it and is exposed to the ultraviolet light In step 515, the wafer with the spacers—which for purposes of identification will be considered the "lower" wafer, e.g., chip 100—is placed in a bonder, e.g., a flip-chip or wafer bonder. The wafer is then aligned and placed in contact with a second wafer without the spacers—which for purposes of identification will be considered the "upper" wafer, e.g., chip 400—in the arrangement necessary to form the desired flip-chip device.

In step 517, the contacted wafers are then pressed together, e.g., with a pressure of 40 grams per square millimeter, at a temperature slightly higher than the soft-bake temperature as specified by the manufacturer of the polyimide precursor for a few minutes, e.g., five minutes, to promote tackiness. Since the soft-bake temperature specified by Arch Chemicals for its polyimide precursor is 100° C., one temperature successfully employed is 120° C. Again, the heating for this step may be performed in accordance with the principles of the invention by passing current through the one or more wires embedded in, or adjacent to, the spacer. However, since the ultimate temperature required for this step is relatively low, the implementer may elect to perform the post-exposure bake in the conventional manner. Note that, in accordance with an aspect of the invention, only the point of contact of the spacer and the corresponding bonding point on the opposite wafer need be so heated. Thus, if there are sensitive devices on either of the chips, it will likely behoove the implementor to apply the heat by passing current through the one or more wires embedded in, or adjacent to, the spacer Upon conclusion of this step, the two wafers will stick together, although the bond between the polyimide precursor and its opposite wafer will not yet have its full strength, which is only achieved after hard bake curing.

In step 519, in accordance with the principles of the invention, current is passed through the one or more wires embedded in, or adjacent to, the spacer to thereby heat the spacer and thereby effectuate the hard bake curing of the spacer.

The manufacturer's recommended hard bake curing process for Arch Chemical's Durimide® 7520 is to heat the precursor at 350° C. for one hour. Doing so yields a bond shear strength of about 50 kg force for a 5 cm$^2$ chip with polyimide posts covering about one fifth of the total area, in accordance with an aspect of the invention. However, using such a high temperature may not be desirable in various applications. Alternatively, it is also possible to perform the hard bake curing at 200° C. for three hours and to thereby achieve substantially the same final bond strength. Furthermore, it has been found that by raising the temperature the time may be reduced, thus providing a range of temperature and time that may be suitable for various applications.

The process is thus completed with the curing to form the fully bonded flip-chip.

Note also that spacers may be formed on both the upper and lower wafers. However, care must be taken that the heights of the spacers and wafer features are such that good contact is made between points to be bonded.

Figure 6:
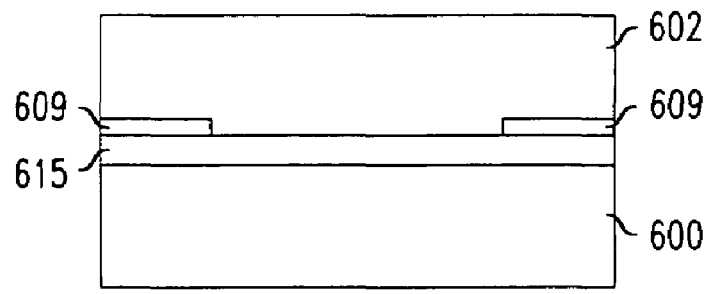
FIGS. 6-11 show various stages of a process to form wires that are embedded higher within the spacer without using optional wire supports as described in connection with FIG. 1, by depositing a layer of spacer-bonding material, then form the wire thereon, and then depositing additional spacer material.

In order to have wires that are embedded higher within the spacer without using optional wire supports 105 as described in connection with FIG. 1, it is advantageous to deposit a layer of spacer-bonding material, then form the wire thereon, and then deposit additional spacer material. This can be achieved by first spin coating spacer-bonding material on a chip to the thickness of the height at which it is desired to form the one or more wires. The result of doing so is shown in FIG. 6, which is a cross sectional view, where spacer-bonding material 602, e.g., polyimide, photo BCB, or the like, covers the surface of chip 600, which includes isolation layer 615, e.g., silicon nitride, on which there has already been formed electrodes 609, e.g., to control the tilt of mirrors when the flip-chip device is operating.

Figure 7:
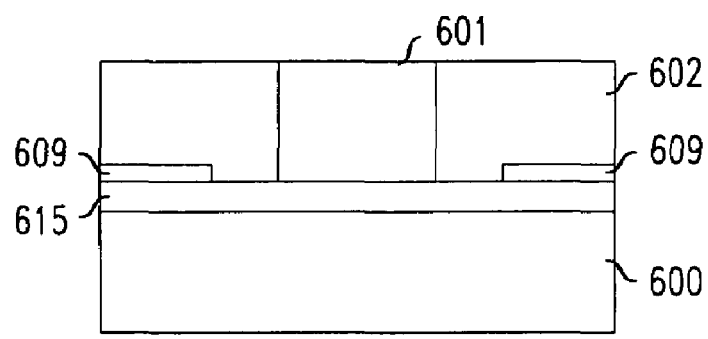
Figure 8:
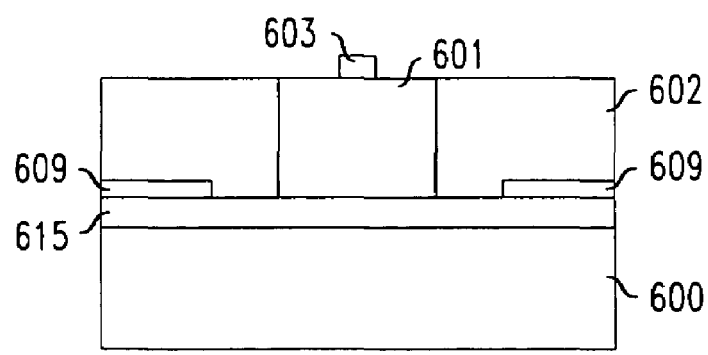
Figure 9:
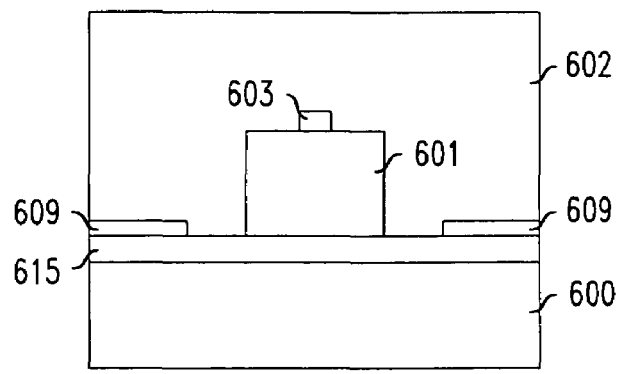
Figure 10:
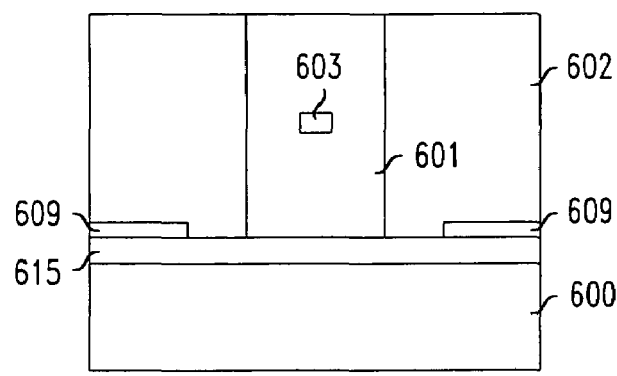
Figure 11:
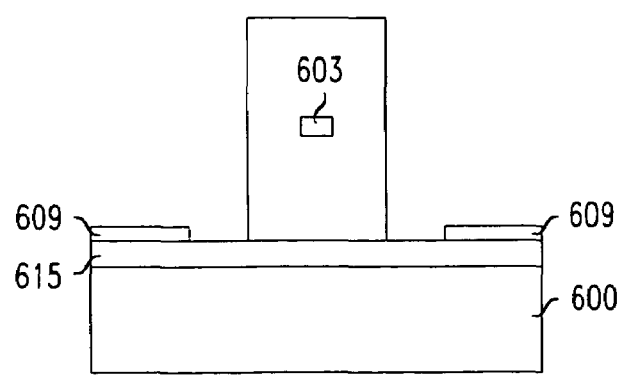

Thereafter, spacer-bonding material 602 is controllably exposed via a mask to ultraviolet light, rendering those portions 601 of spacer-bonding, material 602 that are exposed to the light, as shown in FIG. 7, not susceptible to removal. FIG. 8 shows the deposit of material on top of the exposed portion of the spacer-bonding material 601 to form wire 603. Additional spacer-bonding material 602 is spun onto the wafer to achieve the final height of the spacer, as shown in FIG. 9. The additional spacer-bonding material is likewise controllably exposed via a mask to ultraviolet light, rendering those portions 601 of spacer-bonding material 602 that are exposed to the light, as shown in FIG. 10 not susceptible to removal. Note that the masks for each of the masking steps need not be the same. The unexposed spacer-bonding material is removed, e.g., by inserting the chip 600 into a developer bath or by use of developer spraying. The resulting remaining material 601 forms a spacer with embedded wire 603 as shown in FIG. 11.

Note that so long as wire 603 is narrower than the desired spacer 601, the first exposing step may be eliminated, since the material immediately below wire 603, i.e., in its shadow, will be prevented from being washed away by the developer by the other material which surrounds it and is exposed to the ultraviolet light.

Multiple wires may be formed within a single spacer not only at different heights, but also at the same height.

What is claimed is:

1. An integrated circuit chip comprising:
   one or more heat-sensitive structures;
   at least one spacer overlying one surface of the integrated circuit chip, the spacer made from a heat curable spacer-bonding material selected from the group consisting of polyimide and photo benzocyclobutene, that bonds to another integrated circuit chip, said spacer being positioned on the surface sufficiently distant from said one or more heat sensitive structures such that said heat sensitive structures are not substantially affected by heating of said spacer, said spacer including;
  at least one wire terminated in respective metal end pads at its two ends, wherein the two end pads overlie and are affixed to the surface of the integrated circuit chip, the wire is offset from the surface of the integrated circuit chip and the other integrated circuit chip by the spacer such that it is not in direct physical contact with either chip where offset, and
    adapted to heat said spacer-bonding material to a sufficient temperature
  wherein upon passing an electric current through the wire, the spacer is heated to a curing temperature of the spacer bonding material and maintained for a time sufficient to complete its curing, such that where the wire is offset, it is surrounded by spacer bonding material which is interposed between the wire and the integrated circuit chips.

2. The invention as defined in claim 1 wherein several different portions of said at least one wire are adapted to heat when an electrical current is passed through said at least one wire.

3. The invention defined in claim 1 wherein said at least one wire is adapted to heat substantially in its entirety when an electrical current is passed therethrough.

4. The invention defined in claim 1 wherein said current is 1 milliamp.

5. The invention defined in claim 1 wherein said at least one wire has a cross section of 1×2 microns.

6. The invention defined in claim 1 wherein said at least one wire associated with said spacer passes through said spacer.

7. The invention defined in claim 1 wherein said at least one wire associated with said spacer passes adjacent to said spacer.

8. The invention defined in claim 1 wherein said at least one wire associated with said spacer is a plurality of wires, and at least one of said plurality of wires passes through said spacer and at least one of said plurality of wires passes adjacent to said spacer.

9. The invention defined in claim 1 wherein said at least one wire associated with said spacer is a plurality of wires, at last two of said plurality of wires passing through said spacer at different heights measured with respect to said integrated circuit.

10. The invention defined in claim 1 wherein said at least one wire associated with said spacer is a plurality of wires, at least two of said plurality of wires passing though said spacer laterally offset from each other.

11. The invention defined in claim 1 wherein said at least one wire associated with said spacer is a plurality of wires, at least two of said plurality of wires passing adjacent to said spacer but on different sides thereof.

12. An integrated circuit chip comprising:
  one or more heat sensitive structures;
  at least one spacer overlying one surface of the integrated circuit chip, the spacer made from a heat curable spacer-bonding material selected from the group consisting of polyimide and photo benzocyclobutene for bonding to another integrated circuit chip, said spacer being positioned on the surface sufficiently distant from said one or more heat sensitive structures such that said heat sensitive structures are not substantially affected by heating said spacer, said spacer including;
    at least one wire terminated in respective metal end pads at its two ends, wherein the two end pads overlie and are affixed to the surface of the integrated circuit chip, and wherein at least a portion of the wire passes through the spacer,
      the wire having at least one portion adapted to heat, and thereby to heat said spacer-bonding material, when an electrical current is passed through the wire, wherein said at least one portion being offset from the surface of the integrated circuit chip and the other integrated circuit chip,
  such that it is not in direct physical contact with either chip over that at least one portion, rather it being surrounded by spacer bonding material which is interposed between that at least one portion and the integrated circuit chips.

13. The invention as defined in claim 12 wherein said wire has a plurality of portions adapted to heat when an electrical current is passed therethrough.

14. The invention as defined in claim 12 wherein said wire substantially in its entirety is adapted to heat when an electrical current is passed therethrough.

15. Apparatus comprising a first integrated circuit chip comprising:
  one or more heat-sensitive structures
  a spacer overlying one surface of the integrated circuit chip, the spacer formed from a material selected from the group consisting of polyimide and photo benzocyclobutene for bonding to a portion of a second chip so as to form a flip-chip, wherein the spacer overlies and is affixed to the first chip; said spacer being positioned on the surface sufficiently distant from said one or more heat sensitive structures such that said heat sensitive structures are not substantially affected by heating of said spacer, and
  means for heating said spacer wherein said heating means is part of the first chip, wherein the heating means has two end pads that overlie and are affixed to the surface of the integrated circuit chip.

16. The invention as defined in claim 15 wherein said means for heating said spacer comprises at least a portion of a wire.

17. The invention as defined in claim 15 wherein said means for heating said spacer passes, at least in part, within said spacer.

18. The invention as defined in claim 15 wherein said means for heating said spacer passes, at least in part, adjacent to said spacer.

19. The invention as defined in claim 1 wherein said spacer-bonding material is heated to a curing temperature.

* * * * *